United States Patent [19]

Terrat et al.

[11] Patent Number: 5,160,537
[45] Date of Patent: Nov. 3, 1992

[54] CHROMIUM-NITROGEN ALLOY SURFACE COATING COMPOSITION

[75] Inventors: Jean-Paul Terrat, Saint-Etienne; Pascal Fort, Villefranche De Rouergue, both of France

[73] Assignee: Centre Stephanois de Recherches Mecaniques Hydromecanique et Frottement, Andrezieux-Boutheon, France

[21] Appl. No.: 597,011

[22] Filed: Oct. 16, 1990

[30] Foreign Application Priority Data

Oct. 20, 1989 [FR] France .................. 89 13739

[51] Int. Cl.$^5$ ............................. C04B 35/58
[52] U.S. Cl. .......................... 106/36; 501/96
[58] Field of Search ............. 106/36; 501/96

[56] References Cited

U.S. PATENT DOCUMENTS 4,486,285 12/1984 Aubert et al. .................. 204/192 C

FOREIGN PATENT DOCUMENTS 0074322 3/1983 European Pat. Off. .
2512070 12/1983 France .

OTHER PUBLICATIONS

CA 76 (26):158940K, 1976.
R. Gillet et al., "Hard chrome coatings deposited by physical vapour deposition", Conference of the Ion Assisted Surface Treatments, Techniques and Processes, Sep. 14–16, 1982, pp. 16.1–16.6.
D. Dubiel, "Characterization of sputter deposited chromium nitride coatings", Praktische Metallographie, Feb. 1989, vol. 26, No. 2, p. 69.
A. Aubert et al., "Hard chrome and molybdenum coatings produced by physical vapour deposition", Thins Solid–Films, Apr. 1985, vol. 126, Nos. 1/2, pp. 61–67.
J. Danroc et al., "Revetements de chrome et molybdene durs elabores par pulverisation cathodique magnetron", Le Vide, Les Couches Minces, Jan.–Feb. 1986, vol. 41, No. 230, pp. 77–83.
G. Cholvy et al., "Obtention et caracteristation de depots realises dans le ternaire Cr–C–N par PVD", Le Vide, Les Couches Minces, Jan.–Feb. 1986, vol. 41, No. 230, pp. 71–75.
D. Wang et al., "The morphology and orientation of Cr–N films deposited by reactive ion plating", Thin Solid Films, Mar. 1990, vol. 185, No. 2, pp. 219–230.

Primary Examiner—A. Lionel Clingman
Assistant Examiner—Mary DiNunzio
Attorney, Agent, or Firm—Young & Thompson

[57] ABSTRACT

Coating for conferring good friction properties upon a substrate and comprising a non-equilibrium alloy of chromium and nitrogen. The alloy comprises, per one hundred atoms, from 87 to 68 atoms of chromium and from 13 to 32 atoms of nitrogen and two phases, a cubic microcrystalline chromium phase containing included nitrogen and a quadratic chromium nitride phase with a stoichiometric deficient nitrogen content relative to the $Cr_2N$ nitride. The ratio of the quadratic nitride lattice parameters is between 1.02 and 1.5. This quadratic nitride was previously unknown and probably can exist only in association with chromium. It resists wear up to five times better than known single-phase chromium-nitrogen alloys and is free of the inherent fragility of two-phase alloys containing hexagonal $Cr_2N$ nitride. The coatings are obtained by magnetron cathode sputtering of chromium with a nitrogen partial presure in a rare gas atmosphere between a maximum and a minimum determined experimentally.

5 Claims, No Drawings

CHROMIUM-NITROGEN ALLOY SURFACE COATING COMPOSITION

BACKGROUND OF THE INVENTION

1. Field of the invention

The invention concerns a non-equilibrium chromium-nitrogen alloy surface coating for conferring good friction properties on a substrate. The invention also concerns a method of applying such coatings.

2. Description of the prior art

The expression "friction properties" when applied to a surface or a coating refers to the properties which determine the friction behavior of the surface or coating as they evolve with time. The parameters which express this behavior are essentially the friction wear rate and the coefficient of friction.

The friction referred to here is true friction between two surfaces, and not lubricated friction where a film of lubricant is interposed between the two solid surfaces and the relative movement essentially occurs between layers of lubricant in the film.

Under severe friction conditions, with a high load per unit area, resistance to wear implies a high hardness of the rubbing surface. However, increasing the hardness of a friction coating usually increases in its fragility, with the risk of premature wear through erosion.

There is a definite correlation between wear rate and coefficient of friction because increasing the coefficient of friction, all other things being equal, leads to an increase of degraded energy and the wear rate is in direct proportion to the degraded energy.

In many applications the energy degraded by friction represents only a minor part of the energy involved; it is then more important to attempt an overall reduction in the wear rate, which depends on the hardness, on the fragility and on the coefficient of friction combined, rather than to reduce the coefficient of friction alone.

In what follows, the expression "good friction properties" means essentially good resistance to wear, including the wearing of fragile coatings by erosion. The typical test will involve measuring the rate of wear or of removal of material on a plane coating in contact with a ring of high speed steel with a load of 20 daN and a sliding speed of 0.55 m/s on the plane coating in water.

The interrelated documents FR-A-2 512 070 and EP-A-0 074 322 describe alloys with good friction properties comprising chromium and an alloying element in the form of carbon or nitrogen in metastable interstitial solution in the chromium with concentrations between a minimum representing saturation of the equilibrium solid solution of the alloying element in the chromium and a maximum representing saturation of the interstitial solution.

In the context of the present invention only the chromium-nitrogen system is considered. In this system the content of nitrogen is expressed as the number of atoms of nitrogen per one hundred atoms of chromium-nitrogen alloy.

In the thermodynamic equilibrium diagram of the chromium-nitrogen system, and moving in the direction of increasing nitrogen content, a solid solution region with 0 to 0.15 atoms of nitrogen per 100 atoms of alloy is followed by a $Cr_2N$ nitride region with 33.3 atoms of nitrogen per 100 atoms of alloy, followed by a region of CrN nitride with 50 atoms of nitrogen per 100 atoms of alloy. The $Cr_2N$ nitride has a hexagonal crystal structure and the CrN nitride has an NaCl type cubic structure. This CrN nitride has all the characteristics of a ceramic. Two-phase chromium-nitrogen alloys are routinely produced with a cubic chromium phase and a hexagonal $Cr_2N$ nitride phase.

The prior art documents cited above, and the document EP-A-0 074 322 in particular, teach saturation of metastable interstitial solutions of nitride in the chromium for 3.5% by weight of nitrogen, which represents substantially 12 atoms percent of nitrogen. These documents teach that the interstitial solutions have a hardness very much greater than that of the chromium (a Vickers hardness of up to 2,200, for example, as compared with 600 for the chromium), and that for concentrations of alloying elements greater than the saturation of the interstitial solution the composition of the alloys was as predicted from the equilibrium diagrams.

These interstitial solutions are obtained by fast cathode sputtering using a chromium cathode on a substrate in a reduced pressure atmosphere consisting of a rare gas containing the alloying element in the combined dissociable state or in the free state.

Metastable interstitial solutions cause distortion of the cubic crystal lattice of the chromium, which could account for the increased hardness.

The applicant has discovered that, going against what might be expected from the prior art, it is possible in the chromium-nitrogen system to obtain metastable alloys comprising more nitrogen than the interstitial solutions mentioned above and which have better friction properties than interstitial solutions combined with a reduced wear rate, freedom from fragility and a relatively low coefficient of friction.

SUMMARY OF THE INVENTION

In one aspect, the invention consists in a coating for conferring upon a substrate good friction properties and comprising a non-equilibrium alloy of chromium and nitrogen wherein the alloy comprises, per one hundred atoms, from 87 to 68 atoms of chromium and from 13 to 32 atoms of nitrogen and two phases, a cubic microcrystalline chromium phase containing included nitrogen and a quadratic chromium nitride phase with a stoichiometric deficient nitrogen content relative to the $Cr_2N$ nitride.

The two-phase alloy with these characteristics has a high hardness (Knoop hardness of approximately 2,000); it has important advantages as compared with known chromium-nitrogen alloys of comparable hardness:

its wear rate is up to three times lower than that of interstitial solutions of nitrogen in chromium in the vicinity of saturation;

its wear rate is substantially the same as that of the CrN and $Cr_2N$ nitrides and of two-phase compounds consisting of chromium and $Cr_2N$ nitride, but it is considerably less fragile; it shows no scaling due to friction and therefore has a service life much longer than that of equilibrium nitride compounds;

using physical vapor phase deposition, the grain size is not influenced by the angle of incidence of the deposition on the substrate. This contrasts with conventional deposition using the same process where the grain size varies greatly with the angle of incidence. This independence of the grain size and the angle of incidence facilitates deposition on substrates of relatively complex shape without it being necessary to use arrangements whereby all parts of the surface of the substrate receive the deposit with the same angle of incidence.

The differences between the equilibrium $Cr_2N$ nitride and the metastable nitrides in accordance with the invention are confirmed by X-ray diffraction examination of the crystal structure, for example, and by the distinctly different properties of two-phase alloys according to whether the nitride phase is quadratic or hexagonal, even when their overall composition is the same. However, it is not at present possible to determine the chemical composition of the quadratic nitride. In particular, it will be readily understood that the metastable nature of the nitride makes phase separation very difficult, entailing the risk of bringing about rearrangements of the composition. In any event, it will be noted that the chemical composition of the nitride is a matter for scientific curiosity only, given that it cannot contribute in practise to the identification or obtaining of the nitride.

It is not even certain that quadratic metastable nitrides are all of the same kind. The ratio of the crystal lattice parameters must be between 1.02 and 1.5, but no preferred values have been noted within this range.

The thickness of the coating is preferably between 0.1 and 50 $\mu$m, more particularly between 5 and 20 $\mu$m. This thickness depends on the wear rate, the intended application and the permissible tolerance. With thinner coatings the grain size of the alloy has to be taken into consideration.

In another aspect, the invention consists in a method of coating an electrically conductive substrate to confer upon it good friction properties wherein chromium is sputtered in a reactive atmosphere of nitrogen in a rare gas confined at low pressure in a chamber with magnetron sputtering means using, in combination with a magnetic field, an electric field established between the anode substrate and a cathode chromium target and generating a plasma under operating conditions such that a non-equilibrium alloy of chromium and nitrogen is deposited, in which method the nitrogen partial pressure in the rare gas is set to a value between a predetermined minimal pressure at which the single-phase alloy is saturated with included nitrogen and a predetermined maximal pressure at which hexagonal chromium nitride $Cr_2N$ begins to form, the alloy then containing per one hundred atoms from 87 to 68 atoms of chromium and from 13 to 32 atoms of nitrogen and two phases, a cubic microcrystalline chromium phase and a quadratic chromium nitride phase with a stoichiometric deficient nitrogen content relative to the hexagonal chromium nitride.

It will be understood that the formation of metastable alloys with relative internal crystalization energy minima separated from the absolute minimum representing the equilibrium alloy by energy barriers that cannot be crossed at the temperatures used implies a sufficient rate of deposition for the arrangements of atoms in the crystals to be fixed in their deposit configuration.

The primary conditions which govern these configurations are apparently the respective fluxes of ionized chromium and nitrogen atoms which reach the substrate and the energy levels of these atoms. The governing laws are not well known, however, and in practise the operator can only alter the measurable parameters of deposition, namely the total pressure of the atmosphere in the chamber, the partial pressure of nitrogen, the potential drop across the discharge, the intensity of the discharge and, to some degree, the trajectories of the ions. These parameters are partially interdependent in the discharge area and the operator controls global parameters.

In particular, the pressure adjustment process is essentially dynamic and results from the controlled flowrate injection of the gases into the chamber connected permanently to a pumping system. It will be understood that the pressure distribution cannot be uniform in the chamber. What is more, the various elements (target and substrate supports) in the discharge area and the presence of the discharge itself cause local pressure disturbances.

Consequently, the minimal and maximal pressures to either side of the deposition range in accordance with the invention must be determined experimentally and will be valid only with a particular sputtering chamber and particular deposition conditions.

For a particular chamber and operating conditions, in particular the total pressure in the chamber and the discharge power of the plasma, the minimal and maximal partial pressures are preferably determined to achieve an appropriate rate of deposition of the chromium onto the substrate by executing a number of depositions onto a number of substrates with staggered partial nitrogen pressures and carrying out a crystallographic analysis of the resulting deposits to determine the minimal and maximal nitrogen partial pressures for the particular chamber and operating conditions.

The rare gas pressure is preferably between 0.1 and 0.5 Pa and the nitrogen partial pressure is preferably between 0.01 and 0.1 Pa.

The discharge power is preferably between 250 and 1,200 $W/dm^2$ of cathode area (chromium target).

The preferred rates of the deposition are between 1 and 10 nm/s.

Secondary characteristics and advantages of the invention will emerge from the following description with reference to some examples.

EXAMPLE 1

Determination of operating conditions

Direct current magnetron cathode sputtering vacuum metalization equipment was used having a metal vapor source and a 30 liter chamber (0.03 $m^3$).

The target cathode was 99.9% pure chromium with a surface area of 2 $dm^2$. The atmosphere in the chamber was a mixture of argon and nitrogen at a total pressure of 0.24 Pa.

Grounded parallelepiped-shape steel substrates 6 cm from the cathode were used. The cathode discharge power was set to 1,800 W.

The substrate temperature was approximately 200° C.

With these conditions a coating 11 $\mu$m thick was obtained in one hour, representing a rate of deposition of 3 nm/s.

A series of substrates was coated with the nitrogen partial pressure increasing in steps of 0.01 Pa from 0.03 Pa to 0.09 Pa. The deposited coating was examined by X-ray diffraction.

For the substrate coated at 0.03 Pa the diffraction diagram represented a cubic single-phase alloy with relatively strong distortion of the lattice. This was a typical diagram for the alloy disclosed in the document EP-A-0 074 322.

For the substrates coated at pressures from 0.04 to 0.08 Pa the diagram represented a two-phase alloy with a cubic phase similar to the alloy formed at 0.03 Pa, with a broadening of the lines typical of fine crystallization. The other phase had a quadratic structure with lattice parameter ratios between 1.1 and 1.3.

For the substrate coated at 0.09 Pa the diagram represented a two-phase alloy with a cubic phase (the chromium) and a hexagonal phase (the known $Cr_2N$ nitride).

On the basis of these results it can be estimated that the minimal and maximal nitrogen partial pressures above and below the formation of a two-phase alloy with a chromium phase and a quadratic nitride phase were respectively 0.035 and 0.085 Pa. Chemical analysis of the coatings obtained with nitrogen partial pressures of 0.03, 0.04, 0.08 and 0.09 Pa show (allowing for the possible measurement accuracy) that the proportions of nitrogen atoms corresponding to these limits are substantially 13 and 32 at %. Note that the limiting partial pressures determined in this way are valid only for operating conditions as in the present example.

EXAMPLE 2

The operating conditions were as in Example 1, with an argon partial pressure of 0.2 Pa and a nitrogen partial pressure of 0.04 Pa.

The analyzed coating contained 15 at % nitrogen.

The structure was two-phase with a highly accentuated microcrystalline chromium phase and a quadratic nitride with (absolute) lattice parameters as follows:

a=285.7 pm c=330.6 pm ratio 1.157

The measured Knoop hardness was 2 100.

EXAMPLE 3

The same equipment was used as for Examples 1 and 2, with the operating conditions slightly modified.

| | |
|---|---|
| Argon partial pressure | 0.3 Pa |
| Nitrogen partial pressure | 0.06 Pa |
| Cathode discharge power | 2 200 W |
| Substrate temperature | 350° C. |
| Substrate bias relative to ground | −100 V |
| Source/substrate distance | 5 cm |
| Duration | 1 h |
| Analysis of the coating obtained showed: | |
| Composition: 20 at % nitrogen | |

Two-phase structure with a microcrystalline chromium phase and a quadratic nitride phase with lattice parameters as follows:

a=280.7 pm c=350.4 pm ratio 1.25
Knoop hardness: 2,300

EXAMPLE 4

A 1 $m^3$ vacuum metallization chamber was used, fitted with a 14 $dm^2$ cathode.

| The operating conditions were as follows: | |
|---|---|
| Argon partial pressure | 0.25 Pa |
| Nitrogen partial pressure | 0.06 Pa |

| -continued | |
|---|---|
| The operating conditions were as follows: | |
| Cathode discharge power | 6 000 W |
| Substrate temperature | 220° C. |
| The substrates were mounted on a turntable biased at −100 V relative to ground. | |
| Duration | 3 h |
| Analysis of the coatings showed: | |
| Composition: 30 at % nitrogen | |

Two-phase structure with a microcrystalline chromium phase and a quadratic nitride phase with lattice parameters as follows:

a=286.5 pm c=321.7 pm

Knoop hardness: 1,800
Shiny appearance (indicating fine grains)

EXAMPLE 5

These tests were applied to 10 μm thick coatings on parallelepiped-shape steel samples. The other rubbing member was a high speed steel ring, rubbing occurring in water at a speed of 0.55 m/s with a load of 20 daN. The contact between the rubbing members was of the plane/cylinder type. The coefficient of friction and the wear rate were determined.

Three coatings were tested.

A) A coating of the type from Example 2.

B) A single-phase chromium-nitrogen alloy coating containing 2% by weight of nitrogen (7 at %) in the form of a supersaturated solid solution with a centered cubic structure (chromium).

C) A two-phase chromium-nitrogen alloy with a chromium phase and a hexagonal $Cr_2N$ chromium nitride

TABLE

| Wear rate | Coefficient of friction |
|---|---|
| A 0.83 nm/s | 0.32 |
| B 4 nm/s | 0.27 |
| C 0.83 nm/s | 0.36 |

One hour into the test without incident the coating A had a polished appearance without defects in the rubbing area.

The test on coating B had to be interrupted before the friction had worn through the coating, which would have occurred in approximately 40 minutes.

The test of coating C had to be interrupted after 20 minutes when localized binding was observed. Profile projection and examination of the rubbing area with a scanning electron microscope showed scaling of the coating that may be attributed to its fragile nature. The fragility of the type C layers was indicated by a scratch test which involves rubbing the surface under test with a diamond indenter on which the load is progressively increased and measuring the level of the resulting acoustic noise. With a type A coating there was no acoustic noise until the indenter passed through the coating and reached the substrate. With the type C coatings, however, the indenter caused scaling which produced acoustic noise.

Many tests which cannot be reported in detail here have been conducted. These tests were concerned in particular with determining the bounds of the domain in which the quadratic nitride can appear and indicated that the nitrogen concentrations ranged from 13 at % just after saturation of the interstitial solid solution of nitrogen in chromium, and that beyond 32 at % of nitrogen only the known and thermodynamically stable hexagonal $Cr_2N$ nitride was formed. This suggests that the quadratic nitride may be stable only if it is associated with chromium.

Tests also showed that the quadratic nitride lattice parameter ratio a/c cannot be less than 1.05 or greater than 1.5.

The tests were also concerned with the deposition conditions. The rates of deposition, measured in terms of the rate of increase of thickness, ranged between 1 and 10 mm/s.

With these rates of deposition the appropriate discharge powers are between 250 and 1,200 $W/dm^2$ of cathode (or target). The most suitable pressures are between 0.1 and 0.5 Pa for the total pressure and between 0.01 and 0.1 Pa for the nitrogen partial pressure.

In practise, coatings less than 0.1 μm thick are found to wear out very quickly; also, their continuity may be suspect if the substrate is not perfectly polished. On the other hand, coatings more than 50 μm thick would generally be more than adequate to resist friction but the time to obtain them would be excessively long. Also, such coatings are likely to modify seriously the original dimensions of the substrate.

It may therefore be assumed that the thicknesses will frequently be between 5 and 20 μm.

Of course, the invention is not limited to the examples described but encompasses all variant executions thereof within the scope of the appended claims.

We claim:

1. Coating for conferring upon a substrate good friction properties, said coating comprising a metastable alloy of chromium and nitrogen, wherein said alloy comprises, per one hundred atoms, from 87 to 68 atoms of chromium and from 13 to 32 atoms of nitrogen in two phases, consisting essentially of a cubic microcrystalline chromium phase containing including nitrogen and a quadratic chromium nitride phase with a stoichiometric deficient nitrogen content relative to the thermodynamic equilibrium hexagonal $Cr_2N$ nitride.

2. Coating according to claim 1 wherein the ratio of the quadratic nitride lattice parameters is between 1.02 and 1.5.

3. Coating according to claim 1 wherein its thickness is between 0.1 and 50 μm.

4. Coating according to claim 3 wherein its thickness is between 5 and 20 μm.

5. A chromium and nitrogen alloy having good friction properties, said alloy being metastable and comprising, per one hundred atoms, from 87 to 68 atoms of chromium and from 13 to 32 atoms of nitrogen in two phases, consisting essentially of a microcrystalline chromium phase and a quadratic chromium nitride phase with a stoichiometric deficient nitrogen content to the thermodynamic equilibrium hexagonal $Cr_2N$ nitride.

* * * * *